United States Patent [19]

Lewis et al.

[11] Patent Number: 5,416,432
[45] Date of Patent: May 16, 1995

[54] MEDIAN PEAK DETECTOR FOR CONTROLLING DISK PICKUP HEAD

[75] Inventors: Stephen H. Lewis, Davis, Calif.; Krishnaswamy Nagaraj, Wescosville; Robert W. Walden, Bethlehem, both of Pa.

[73] Assignee: AT&T Corp., Murray Hill, N.J.

[21] Appl. No.: 176,392

[22] Filed: Dec. 30, 1993

[51] Int. Cl.[6] ............... G01R 19/00; G11C 27/02
[52] U.S. Cl. ............................... 327/60; 327/58; 327/94; 360/75
[58] Field of Search ............ 360/75, 76, 77.02, 77.05, 360/77.06, 77.07, 77.08; 327/58, 60, 91, 94, 403

[56] References Cited

U.S. PATENT DOCUMENTS

| | | | |
|---|---|---|---|
| 4,380,033 | 4/1983 | Bacrania | 360/77.07 |
| 4,868,470 | 9/1989 | Bucska et al. | 327/58 |
| 5,345,216 | 9/1994 | Chopra et al. | 327/58 |

*Primary Examiner*—Timothy P. Callahan
*Assistant Examiner*—Toan Tran

[57] ABSTRACT

A circuit which detects the median peak of a burst of pulses. The peak value of each pulse in a pulse burst is detected and stored. The peak value of each pulse is then compared to the peak value of every other pulse and the results of the comparison are used to determined the median peak.

9 Claims, 7 Drawing Sheets

FIG. 1

BURST A    BURST B    BURST C    BURST D

MEDIAN PEAK DETECTOR FOR CONTROLLING DISK PICKUP HEAD

BACKGROUND OF THE INVENTION

The present invention relates to method and apparatus that detects the peak amplitude of pulses. More specifically, the present invention relates to method and apparatus that detects the median peak amplitude of a burst of pulses.

Peak detection of signals is commonly used in many electronic applications. One such application is found in computer disk drives. Typically, the disk drive includes, among other things, a pick-up head that reads data from various tracks on the disk and a servo controller that properly positions the pick-up head over a track of data. The information used by the servo controller to properly position the pick-up head is contained in the amplitude of specialized servo signals contained at various locations on the tracks of data. The pickup head detects these servo signals and transmits them to the servo controller. Then, the servo controller detects the peak amplitude of the servo signals to determine whether the pick-up head is properly positioned over a data track.

Figure 1:
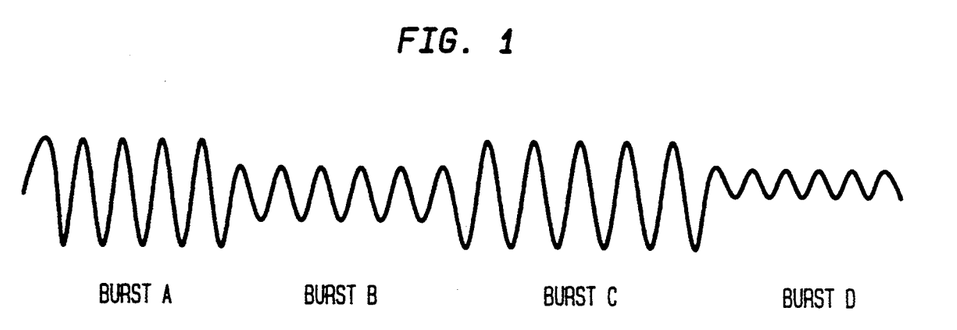
FIG. 1 illustrates a typical servo control signal which consists of series of bursts of pulses.

In some systems, the servo control signals consist of four bursts of sinusoid signals, with each burst including five to ten sine waves. Such a burst of pulses is illustrated in FIG. 1. In such multiple pulse systems, it is necessary to determine the amplitude of the pulses in the bursts.

One conventional way to do this is to use a single peak detector to monitor each burst of sinusoids. In accordance with this technique, the peak detector is always on so that the largest peak in the burst is determined. Unfortunately, the individual sinusoidal pulses are prone to noise, so that this technique is less than desirable.

In a second conventional technique, the individual peaks are detected separately and then averaged, thereby reducing the effects of noise. There are, however, several disadvantages to this technique. For example, this technique is very sensitive to pulse "drop outs," which occur with some regularity. Also, this technique requires expensive precision linear analog circuitry.

Accordingly, it is an object of the present invention to detect the peak amplitude of a burst of pulses so as to provide immunity to noise and pulse drop-outs.

SUMMARY OF THE INVENTION

The present invention provides method and apparatus for determining the median peak amplitude of a burst of pulses. In accordance with the present invention, the peak amplitude of each pulse in a burst of pulses is detected and stored. Each detected peak amplitude is compared with every other detected peak value. Then, the median peak value is determined based on the results of the comparisons.

The apparatus of the present invention includes a peak detector, several sample and hold circuits, a latching circuit and a logic circuit. The sample and hold circuits detect and store the peak amplitude of each pulse in a burst and also provide a comparison of the peak amplitude of each pulse to every other pulse. These comparisons are latched by the latching circuit and transmitted to a logic circuit so that the median amplitude can be selected.

DESCRIPTION OF THE PREFERRED EMBODIMENT

Figure 2:
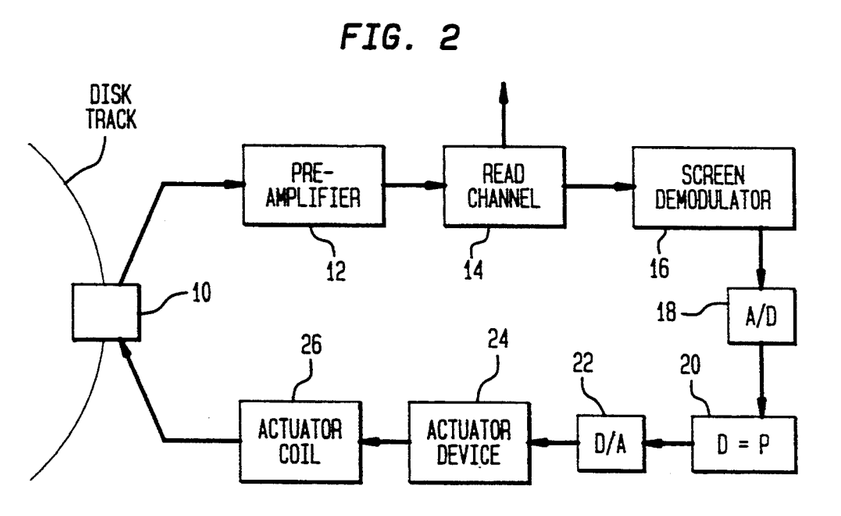
FIG. 2 is a block diagram of a servo control system for a disk drive.

FIG. 2 illustrates a block diagram of a typical servo control system. A pick-up head 10 is located over a disk to read information from a track located on the disk. The information on the disk includes, among other things, specialized servo information which is meant to control the position of the pick-up head 10. It also includes other information which a computer uses for various tasks.

The pick-up head 10 sends the information it reads from the track on the disk to a preamplifier 12 and then to a Read channel 14. The Read channel 14 separates the specialized servo information from the other information. It sends the servo information to a servo demodulator 16 and it sends the other information elsewhere.

The servo information sent to the servo demodulator 16 is a burst of pulses, as illustrated in FIG. 1, which shows four bursts of pulses (each successive burst is labeled as Burst A, Burst B, Burst C and Burst D). Each burst contains at least five pulses, although there may be as many as ten or, if pulses "drop-out," less than five. The peak value of each pulse will be referred to as $V_n$ wherein n is the pulse number in the burst.

The servo demodulator 16 processes the four bursts of pulses in FIG. 1 to determine the proper position of the pickup head 10. The servo demodulator 16 does this by determining the peak amplitude of each of the bursts of pulses. In accordance with the present invention, peak amplitude of a burst of pulses is determined by determining the peak value of each pulse in a burst and storing the result. During this process, the peak value of each pulse is compared to the peak value of every other pulse. The median of the peak values is then selected, based on the comparisons, and sent to an analog-to-digital (A/D) converter 18 and then to a digital signal processor (DSP) 20. This is done for each burst. For convenience, the signals sent to the A/D 18 and to the DSP 20 are referred to as A, B, C, and D (i.e., the peak values or amplitudes associated with Bursts A, B, C, and D, respectively). The digital signal processor (DSP) 20, therefore, receives four digital values which represent the median of the peaks of the pulses in each burst.

The DSP 20 processes the signals A, B, C and D to determine whether the head 10 is properly positioned. Typically, the DSP 20 performs the operation A minus B. By convention, if A minus B equals zero, then the head 10 is properly positioned. If, however, the operation A minus B yields something other than zero, the head 10 is "off-track" and must be repositioned. The DSP 20 also typically performs the operation C minus D. When the head 10 is on-track, this operation yields a maximum value. However, as the head 10 goes off-track, this operation starts to yield results which get closer to zero. Some servo systems will begin to utilize the results from this second operation (C minus D) if the head 10 is severely off-track.

As a result of these operations, the DSP 20 sends a signal through a digital-to-analog (D/A) converter 22, through an actuator device 24 and through an actuator coil 26 to control the position of the pick-up head 10.

Figure 3A:
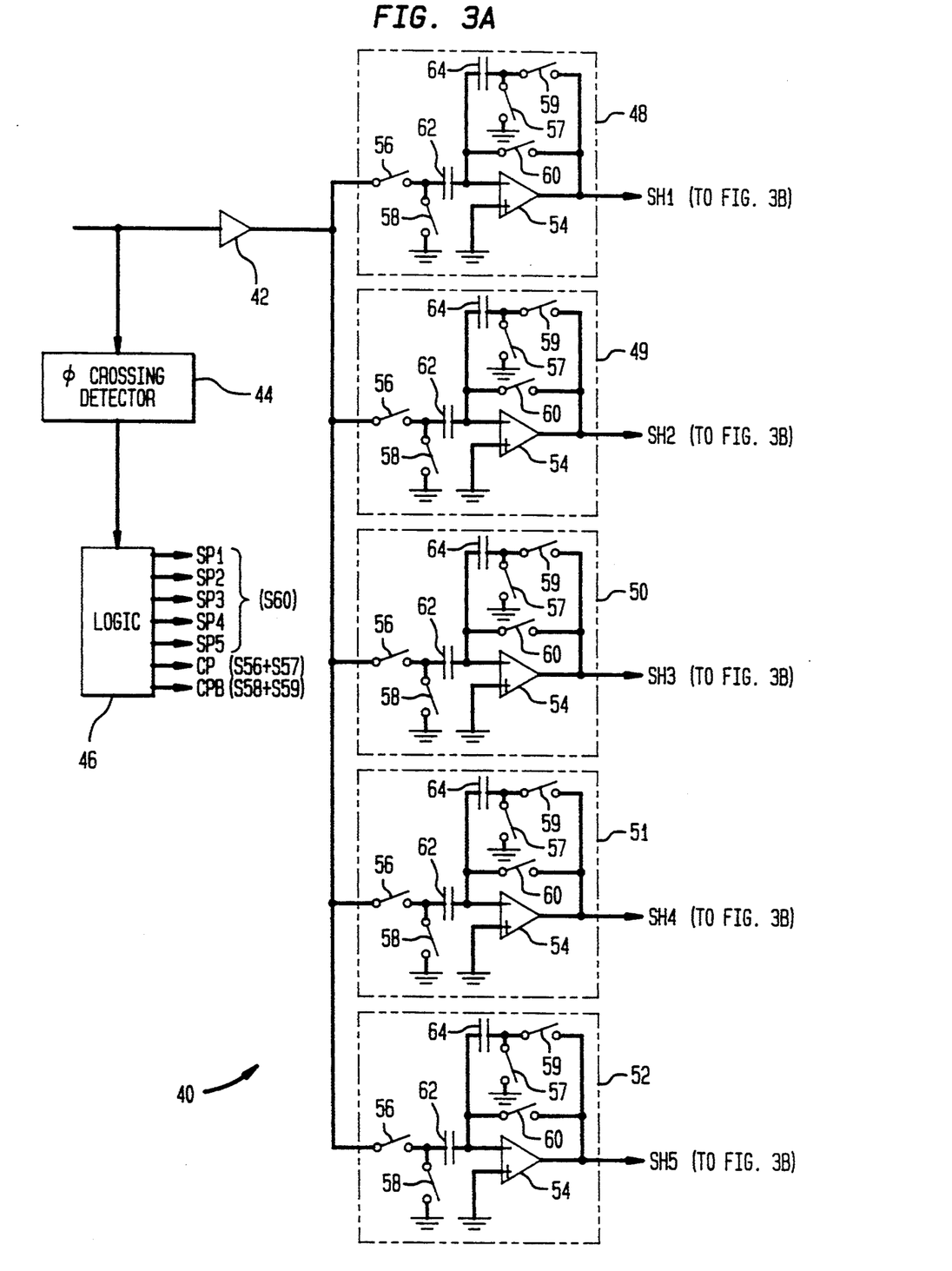
FIGS. 3A to 3B are schematic diagrams of a circuit in accordance with a preferred embodiment of the present invention.
Figure 3B:
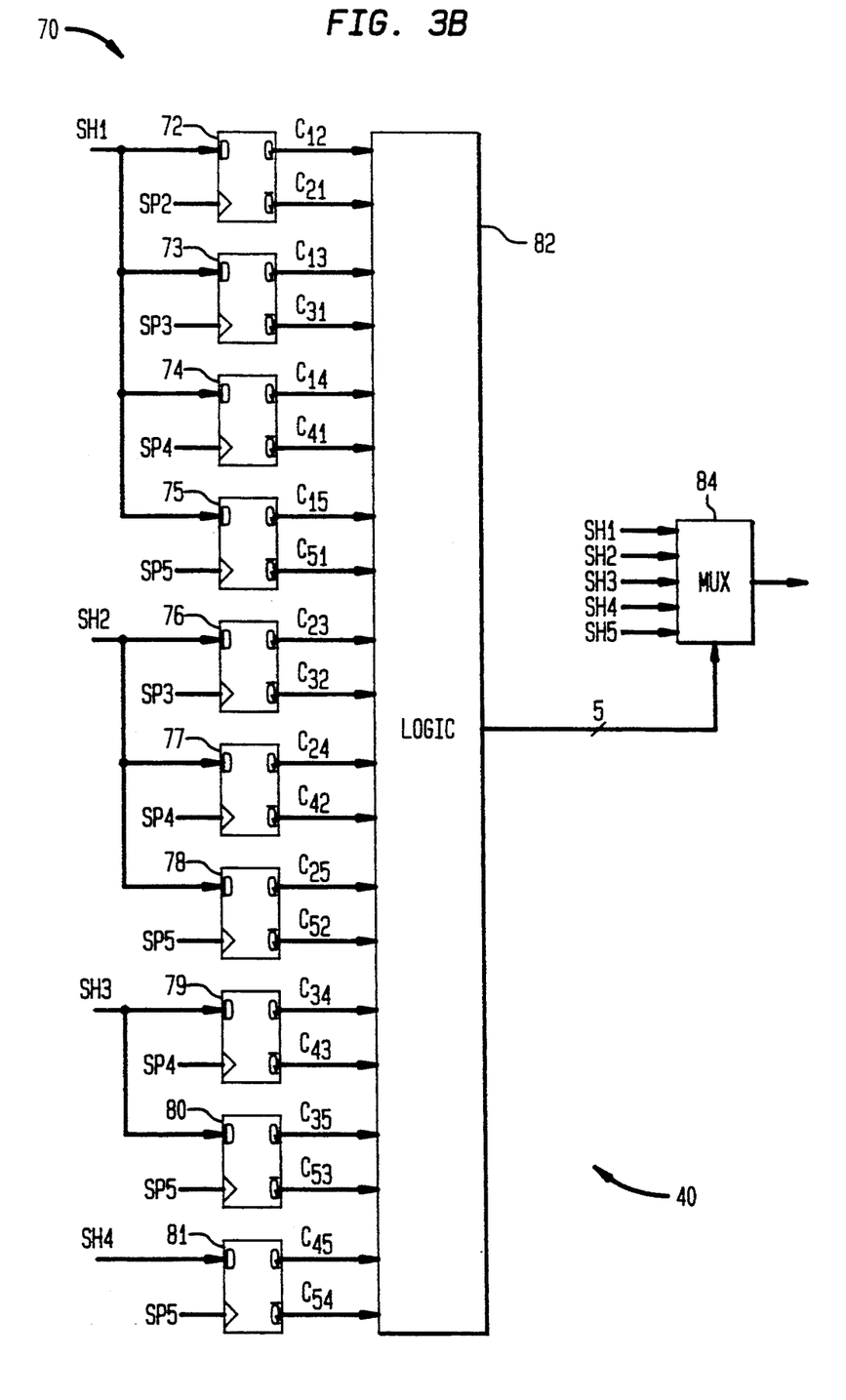

A preferred embodiment of the circuit that implements the present invention is illustrated in FIGS. 3A to 3B. Referring to FIG. 3A, the circuit 40 includes a peak detector 42 which has an input adapted to be connected to the source of the burst of pulses shown in FIG. 1. Any of the many known peak detector circuits can be used to implement the detector 42. The source of the bursts is also connected to a zero crossing detector 44 whose output is sent to a logic circuit 46. The logic circuit 46 generates control signals SP1 to SP5 and CP and CPB.

The circuit 40 also includes five samples and hold circuits 48 to 52. Each sample and hold circuit 48 to 52 is identically configured and includes an amplifier 54, five switches 56 to 60, and two capacitors 62 and 64, as illustrated.

In each sample and hold circuit 48 to 52, the output of the peak detector 42 is sent through the switch 56 and the capacitor 62 to the negative input terminal of the amplifier 54. The switch 58 is connected serially between ground and the interconnection of the switch 56 and the capacitor 62. The positive input terminal of the amplifier 54 is also connected to ground.

The feedback circuit for the amplifier 54 is formed with the switches 57, 59 and 60 and the capacitor 64. The switch 60 is connected directly between the output and the negative input terminal of the amplifier 54. The switch 59 and the capacitor 64 are serially connected between the output and the negative input terminal of the amplifier 54 so that they are in parallel with the switch 60. The switch 57 is serially connected between ground and the interconnection of the switch 59 and the capacitor 64.

Referring to FIG. 3B, the circuit 40 includes a comparison latching circuit 70. The comparator circuit 70 includes ten latches 72 to 81. The output SH1 of the sample and hold circuit 48 is connected to the D input of the latches 72 to 75. The output SH2 of the sample and hold circuit 49 is connected to the D input of the latches 76 to 78. The output SH3 of the sample and hold circuit 50 is connected to the D input of the latches 79 and 80. The output SH4 of the sample and hold circuit 51 is connected to the D input of the latch 81.

The circuit 40 also includes a logic circuit 82 and an analog multiplexer 84. The outputs (Q and Q-bar) from each latch 72 to 81 are sent to the logic circuit 82 so that the median of the peaks stored in the sample and hold circuits 48 to 52 can be determined. The output of the comparator circuit 80 is then sent to the select inputs of the analog multiplexer 84 to choose the median peak value from the voltages $V_1$ to $V_5$.

The operation of the circuit 40 illustrated in FIGS. 3A and 3B will now be explained. The burst of pulses is input to the peak detector 42 and the zero crossing detector 44. When a zero crossing is detected, the logic circuit 46 is enabled so that control signals SP1 to SP5 and CB and CPB are generated. The control signal CP controls the operation of the switches 56 and 57 in each of the sample and hold circuits 48 to 52. Similarly, the control signal CPB controls the operation of the switches 58 and 59. The control signal SP1 controls the operation of the switch 57 in the sample and hold circuit 48. The control signal SP2 controls the operation of the switch 57 in the sample and hold circuit 49. The control signal SP3 controls the operation of the switch 57 in the sample and hold circuit 50. The control signal SP4 controls the operation of the switch 57 in the sample and hold circuit 51. The control signal SP5 controls the operation of the switch 57 in the sample and hold circuit 52. The control signals SP2 to SP5 also provide clocking signals for the latches 72 to 81, as indicated in FIG. 3B.

Figure 4:
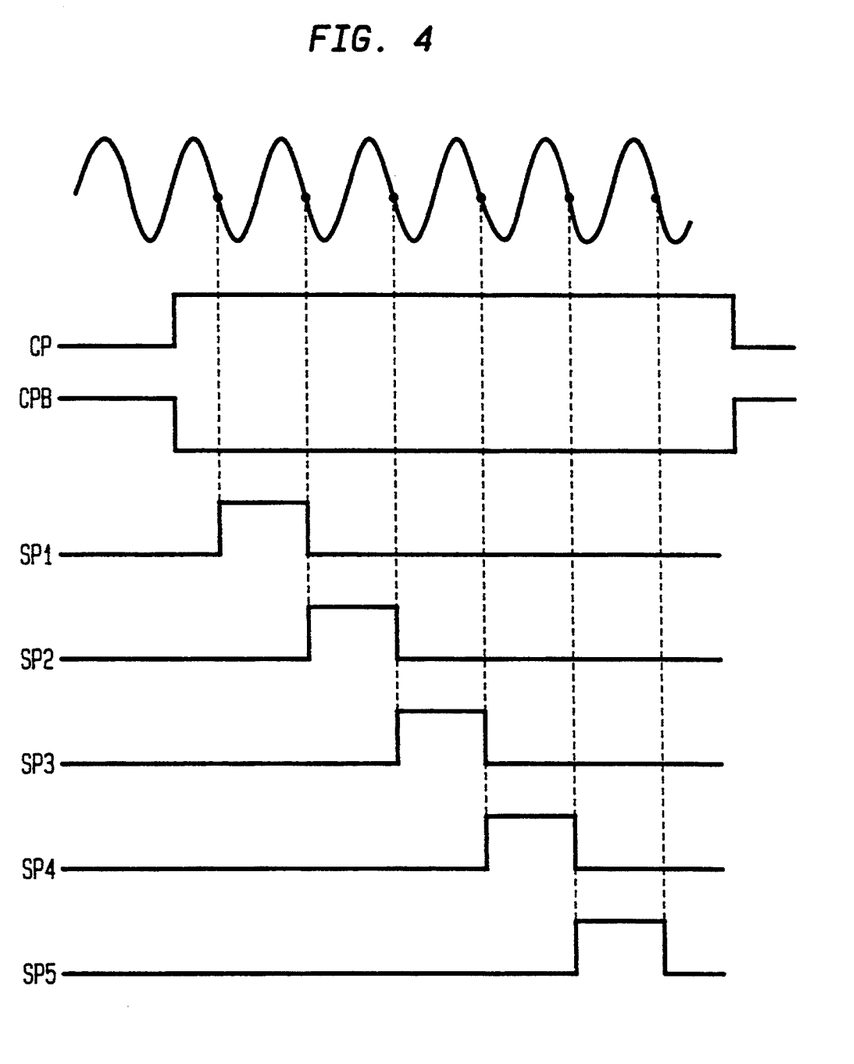
FIG. 4 is a timing diagram of control signals associated with the circuit of FIG. 3A.

Referring to FIG. 4, the timing of the control signals relative to a burst of pulses is illustrated. On the first zero crossing, CP is enabled. CP remains enabled for five pulses, although the number of pulses that CP remains enabled may be varied, depending on the circuitry 40. CPB is also generated and, as indicated, is simply the inverse of CP.

Once CP is enabled, the control signal SP1 is enabled on the next zero crossing and then disabled on the following zero crossing so that SP1 is enabled for one period of a sinusoid pulse. At the same time SP1 is disabled, SP2 is enabled for one period of the sinusoid. In like manner, SP3, SP4 and SP5 are generated.

When CP is enabled, the switches 56 and 57 in the sample and hold circuits 48 to 52 are closed. Since CPB is the inverse of CP, CPB is disabled and the switches 58 and 59 in the sample and hold circuits 48 to 52 are opened.

During the first peak, SP1 is enabled so that the switch 60 in the sample and hold circuit 48 is closed. The peak detector 42 passes the peak value of the first pulse $V_1$, to charge the capacitor 62 in the sample and hold circuit 48 to the peak voltage $V_1$. Since SP1 is disabled at the end of the first pulse, the peak voltage $V_1$ is stored on the capacitor 62 in the sample and hold circuit 48.

During the second pulse of the burst, SP2 is enabled so that the switch 60 in the second sample and hold circuit 49 is closed. During this time period the capacitor 62 in the second sample and hold circuit 49 is charged to the peak value of the second pulse, $V_2$. Also, a signal representing the difference between $V_1$ and $V_2$ is placed at the output SH1 of the first sample and hold circuit 48. This difference is clocked into the latch 72 when SP2 is disabled.

During the third pulse of the burst, SP3 is enabled so that the switch 60 in the third sample and hold circuit 50 is closed. The capacitor 62 in the third sample and hold circuit 50 is charged to the peak value $V_3$ of the third pulse. At the same time, the difference between $V_3$ and $V_1$ is output from the first sample and hold circuit 48 and the difference between $V_3$ and $V_2$ is output from the second sample and hold circuit 49. These differences, $V_3-V_1$ and $V_3-V_2$, are clocked into latches 73 and 76, respectively, when SP3 is disabled.

The remaining steps follow a similar process. During the fourth pulse of the burst, SP4 is enabled so that in the fourth sample and hold circuit 51, the switch 60 is closed and the capacitor 62 is charged to the peak value $V_4$ of the fourth pulse. At the same time, the differences, $V_4-V_1$, $V_4-V_2$ and $V_4-V_3$ are output from the sample and hold circuits 48, 49 and 50, respectively. When SP4 is disabled, these differences are clocked into the latches 74, 77 and 79, respectively.

During the fifth pulse, SP5 is enabled, so that in the fifth sample and hold circuit 52, the switch 60 is closed and the capacitor 62 is charged to the peak value, $V_5$, of the fifth pulse. At this time, the differences, $V_5-V_1$, $V_5-V_2$, $V_5-V_3$, $V_5-V_4$, are output from the sample and hold circuits 48, 49, 50 and 51, respectively. When SP5 is disabled, these differences are clocked into the latches 75, 78, 80 and 81, respectively.

At the end of the fifth pulse, the control signal CP is disabled and the control signal CPB is enabled. As a result, switches 56 and 57 are opened and switches 58 and 59 are closed. Thus, the voltages $V_1$ to $V_5$ stored on the capacitor 62 in each of the sample and hold circuits 48 to 52, respectively, are transferred to the outputs SH1 to SH5, respectively, and made available at the inputs of the multiplexer 84.

The median of these peak values, $V_1$ to $V_5$, is determined by the logic circuit 82 as a result of the value stored in the latches 72 to 81. Once the median is determined, the logic circuit 82 outputs a select signal to the multiplexer 84 to select the median value of the voltages $V_1$ to $V_5$ from the comparisons which are stored in the flipflops 72 to 81.

The operation of the logic circuit 82 will now be explained. The outputs from the latches 72 to 81 are grouped into status words such that a given status word represents the comparison of a given value with all of the other values. For this purpose, each binary digit of a given status word represents the comparison of the given value with one of the other values. For example, in the illustrative embodiment, five status words having four digits each are formed as follows:

$W_1 = C_{12}C_{13}C_{14}C_{15}$ $W_2 = C_{21}C_{23}C_{24}C_{25}$ $W_3 = C_{31}C_{32}C_{34}C_{35}$ $W_4 = C_{41}C_{42}C_{43}C_{45}$ $W_5 = C_{51}C_{52}C_{53}C_{54}$

It can thus be seen that status word $W_1$ represents the comparison of the first value ($V_1$) with each of the other values, and so forth for the other status words. Therefore, each status word gives a direct indication of the relative amplitude of the corresponding value. For instance, the highest value corresponds to the status word 1111, and the lowest value corresponds to the status word 0000. The median value has a corresponding status word that has an equal number of 1's and 0's in the usual case of an odd number of values. That is, in the illustrative case of five values, the status word for the median value has two 1's and two 0's, and hence is one of the following words: 0011, 0101, 1010, 1100, 0110 and 1001. The median value decision may be made by decoding the five status words.

In a preferred embodiment, the decoding may be accomplished by a technique that first detects the highest and lowest value of the five values, then detects the next highest and lowest value, etc., until the median is obtained. In the illustrative case of five values, this may be accomplished as follows:

Step 1: Detect the highest and lowest of the five values. This is readily accomplished by detecting the coincidence of the status words with 1111 and 0000.

Step 2: Exclude the highest and lowest values detected in step 1. This leaves three values.

Step 3: Among the three remaining values, once again detect the highest and lowest values. This is accomplished by detecting which two of the status words contain either three 1's or three 0's; i.e., which are equal to any of the following: 1110, 1101, 1011, 0111, 0001, 0010, 0100, 1000.

Step 4: Exclude the highest and lowest of the three values detected in step 3. This leaves the remaining value as the median in the ideal case.

If desired, an additional step, discussed below, may optionally be included to take care of the case resulting from ambiguous outputs of the comparators, which may lead to more than one word representing a possible median.

Figure 5:
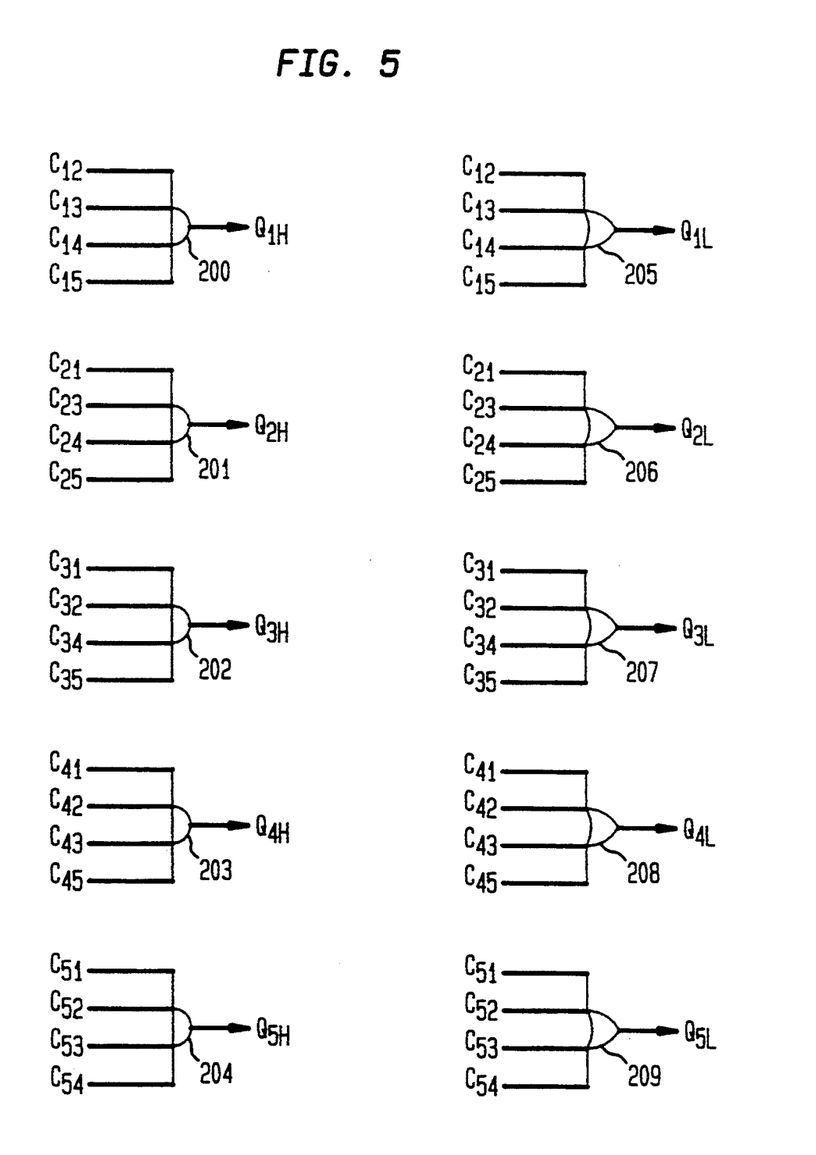
FIGS. 5 to 7 shows a preferred embodiment of the logic circuit of FIG. 3B.
Figure 6:
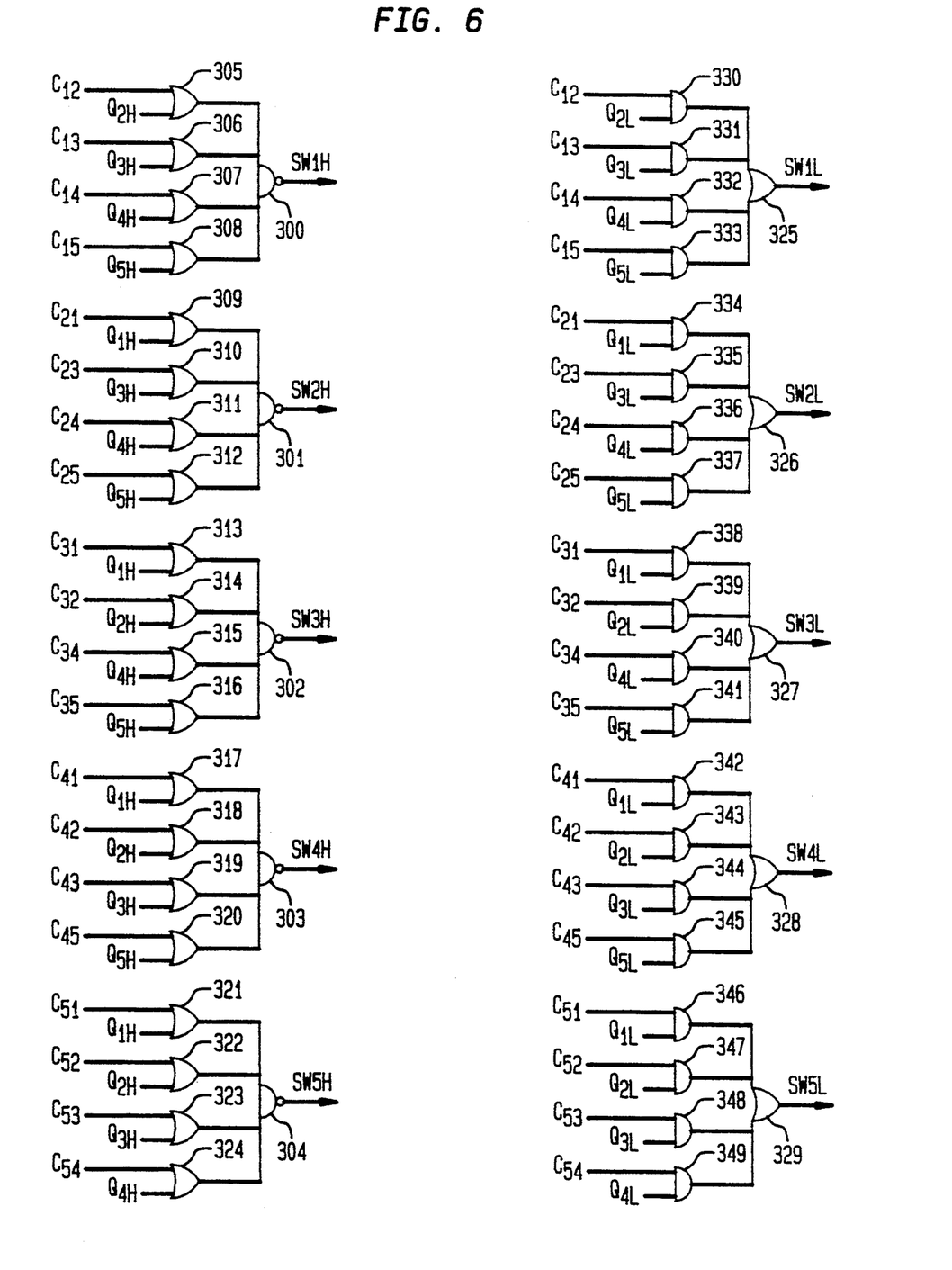
Figure 7:
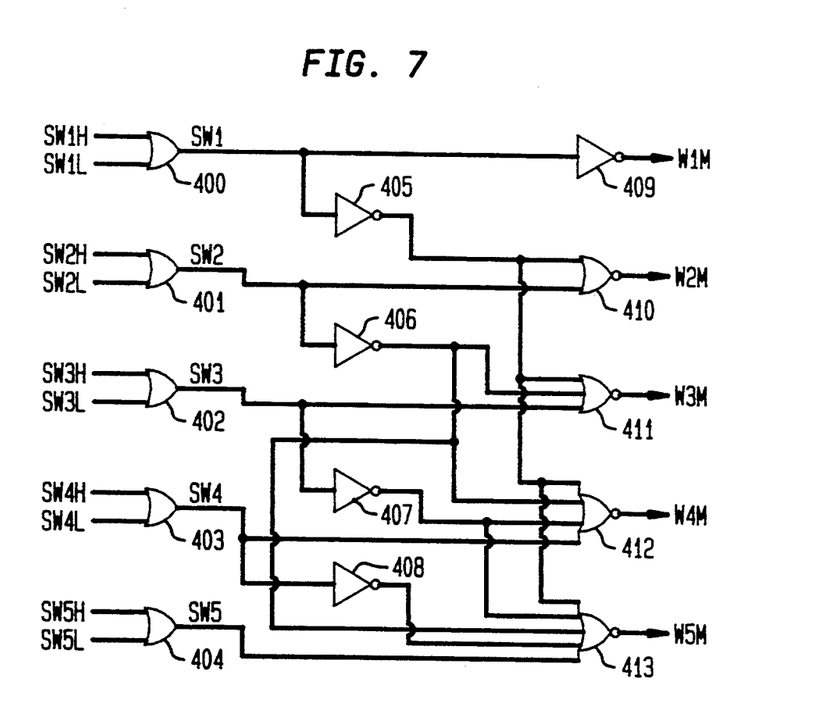

A circuit diagram of one possible implementation of this scheme is shown in FIGS. 5 to 7. It is noted that this scheme and the illustrated circuit is the subject of a co-pending patent application serial No. 08/055,607, filed Apr. 30, 1993, which is hereby incorporated by reference. The first stage illustrated in FIG. 5, includes ten coincidence detectors. Five of these, which are AND gates 200-204, detect coincidence of the five status words with 1111. Such coincidence results in one of the output signals $Q_{1H}$, $Q_{2H}$, $Q_{3H}$, $Q_{4H}$, $Q_{5H}$ to be at a high voltage state; i.e., equal to logic "1." The other five coincidence detectors are OR gates 205-209, which detect coincidence with 0000. Such coincidence results in one of the output signals $Q_{1L}$, $Q_{2L}$, $Q_{3L}$, $Q_{4L}$, $Q_{5L}$ to be at a low voltage state; i.e., equal to logic "0." The second stage, illustrated in FIG. 6, includes ten coincidence detectors. However, the inputs to these are gated with the outputs from the first stage. This eliminates from the comparison the two values which were detected as the highest and lowest by the first stage. For example, if the value $V_2$ is detected as the highest by the first stage, then $Q_{2H}$ will be high. This disables $C_{12}$, $C_{32}$, $C_{42}$, and $C_{52}$ from gates 300, 302, 303 and 304 in FIG. 6, thereby allowing these gates to detect the highest among the remaining values under consideration, $V_1$, $V_3$, $V_4$ and $V_5$. Similarly, if the value $V_4$, for example, is detected as the lowest among the five values by the first stage, then the signal $Q_{4L}$ will be low. This disables $C_{14}$, $C_{24}$, $C_{34}$ and $C_{54}$ from gates 325, 326, 327 and 329 in FIG. 6, thereby allowing these gates to detect the lowest among remaining values $V_1$, $V_2$, $V_3$ and $V_5$.

After processing by the first and second stages as described above, only one value remains from the five values which is neither the highest nor lowest. Thus, for that particular value ($V_x$), both the signals SWXL and SWXH are zero. The output stage shown in FIG. 7 combines these in OR gates 400-404 to generate a composite output designated SWX, which is low if $V_x$ is the median value. Ideally, only one among SW1, SW2, SW3, SW4 and SW5 is low after performing the comparisons, thereby resulting in an unambiguous detection of the median. However, when two or more of the values are very close to each other, there may be errors in the comparison, due to comparator inaccuracies. In such situations, more than one among SW1 to SW5 can be low, indicating that more than one of the values is the median. However, it can be seen from a careful analysis of the circuit that the above technique ensures that this happens only for values which are closer to each other than the comparator sensitivity (i.e, minimum distinguishable input differential). Once the values are that close, any of them may be considered to be the median, as by the priority assignment scheme discussed below.

Priority Assignment: The output stage shown in FIG. 7 incorporates a technique in which the logic detects situations where more than one of the values appear to be the median, and then forces the final output (WXM) to point to only one of those values in a prioritized order. This is accomplished using inverters 405-408, which cause any of the NOR gates 410-413 to which they are connected to be at low output when the input of any given inverter is low. That is, when the output of any OR gate 400-404 is low, it forces the outputs of the NOR gates 410-413 lower in priority to be low, with output W1M having the highest priority, and output W5M having the lowest priority. For example, if SW1, SW4 and SW5 all are low, the output of inverter 405 (and 408) is high, ensuring that the outputs W2M-W5M of all the lower-priority NOR gates 410-413 are low, and hence only W1M = 1. Thus, the value $V_1$ is declared as the median. This is appropriate because obviously the values $V_1$, $V_4$ and $V_5$ in this case are very close to each other, and there is no loss of precision in declaring only one of them the median. The priority assignment in FIG. 7 has the order, from highest to lowest, of $V_1$, $V_2$, $V_3$, $V_4$, $V_5$. However, this order can be changed if desired simply by suitably altering the inputs to the gates 410-413.

Missing Values: One of the potential applications of the inventive median value detector technique is for improving noise immunity in communication systems. In such systems, the values typically arrive in sequence. It is possible that in the presence of severe media errors or defects, not all the values are received. In the case of magnetic recording media, the missing values are referred to as "dropouts." In that case, it is desirable to perform a median value detection on whatever values are received. This can be achieved by properly initializing the latches which may be used to hold the comparator decisions. Consider the following initialization:

$$W_1 = C_{12}C_{13}C_{14}C_{15} = 1010$$

$$W_2 = C_{21}C_{23}C_{24}C_{25} = 0010$$

$$W_3 = C_{31}C_{32}C_{34}C_{35} = 1110$$

$$W_4 = C_{41}C_{42}C_{43}C_{45} = 0000$$

$$W_5 = C_{51}C_{52}C_{53}C_{54} = 1111$$

As shown below, presetting $W_1$ to $W_5$ to the above combination enables the circuit to appropriately handle situations where less than five values are received. Consider the following cases:

Case 1: Only four values ($V_1$, $V_2$, $V_3$, $V_4$) are received: In this case, the comparisons with $V_5$ do not occur at all. Thus, the word $W_5$ remains in its initial state whereas the words $W_1$-$W_4$ get altered in accordance with the amplitudes of $V_1$-$V_4$. The first stage of the median value detector eliminates $V_5$ by recognizing it as the "highest," since $W_5 = 1111$. The lowest among the four valid values $V_1$-$V_4$ is also eliminated in the first stage. The remaining three values are processed by the second stage. It is easily seen that the final result is that the second highest of the four valid values is declared as the median. Alternatively, if $W_5$ had been initialized as 0000 and $W_4$ as 1111, then the second lowest among $V_1$-$V_4$ would be chosen as the median. Either alternative produces the closest possible approximation to the median value from among the four values.

Case 2: Only three values ($V_1$, $V_2$, $V_3$) are received: In this case the comparisons with both $V_4$ and $V_5$ do not occur at all. Thus, both the words $W_4$ and $W_5$ remain in their initial state. The first stage of the logic eliminates both $V_4$ (as the lowest) and $V_5$ (as the highest). The remaining valid values $V_1$-$V_3$ are processed by the second stage. The result is that the true median among the three valid values is declared as the median.

In the above two cases, the designations of $V_1$, $V_2$, . . . are used to represent the relative sequence of the values that actually arrive. Any single missing value (e.g., dropout) may be designated to be value $V_5$ by the receiving circuitry, regardless of the position of the dropout in the sequence as transmitted. Similarly, any two missing values may be designated to be $V_4$ and $V_5$, regardless of their position in the sequence actually transmitted, and so forth. This may be readily accomplished by simply designating $V_1$, $V_2$ . . . to the values that actually arrive, with any missing values then being given the remaining designations. To determine whether a value actually arrives, the operation of the latches that store the digital comparison may be monitored. Any missing value does not cause a change in the preset value of the latches that store the status word corresponding to that value. For example, a single missing value will leave four latches unaltered from their present value. Therefore, the preset values of the words associated with the missing values will be used in the comparison process, regardless of the sequence in which the missing values were actually transmitted. However, other designation schemes may be used if desired.

The above preferred embodiment has shown one technique for determining the median value, by successively excluding the highest and lowest values. While the above embodiment has been shown for determining the median of five values, the inventive technique may be used with any number of values, typically an odd number. For example, the median of a set of three values may be found in a single logic comparison stage, wherein the highest and lowest values are excluded. Similarly, the median of a set of seven values may be found using three stages of logic comparison, and so forth for larger sets of values. The described sequential comparison technique provides for a high-speed circuit that may be readily included on an integrated circuit. However, other techniques are possible. For example, since the median value has an equal number of 1's and 0's, the word that represents the median may e directly determined by matching the words with all possible values of the median. In the illustrative case of five values, the word that corresponds to the median value then has one of the following six values: 0011, 0110, 0101, 1001, 1010, 1100. Alternatively, the word corresponding to the median value could be determined by adding the digits in the word. In the illustrative case, the word having two 1's has a numerical value of two when its digits are added together. Hence, a programmable processor, for example, could be used to perform this computation to determine the median value. In the case where a larger number of pulses than five is used, the circuitry 40 of FIGS. 3A and 3B must also be modified accordingly.

The above-described method and apparatus is intended to be merely illustrative of the principles of the present invention. Numerous modifications and adaptions thereof will be readily apparent to those of ordinary skill in this art without departing from the spirit and scope of the present invention.

We claim:

1. A method of detecting the median peak of a burst of pulses, comprising the steps of:

detecting the peak amplitude of each pulse in the burst;

comparing each peak amplitude with every other peak amplitude; and determining which of the peak amplitudes is the median value from the comparisons.

2. The method of claim 1, the step of detecting further comprising the step of storing the detected peak amplitude of each pulse.

3. The method of claim 2, wherein the steps of detecting, storing, comparing and determining are performed for each burst of pulses and further comprising the step of controlling the position of a pickup head in a disk drive with the determined median peak value.

4. A median peak detector for determining the median amplitude of a burst of pulses, comprising:

means for detecting the peak amplitude of each pulse in the burst;

means for comparing each detected peak amplitude with every other peak amplitude; and means for determining which of the peak amplitudes is the median value for the comparisons.

5. The median peak detector of claim 4, the means for detecting further comprising means for storing the detected peak amplitude of each pulse.

6. The median peak detector of claim 5, wherein the median value of the peaks is determined for each burst of pulses.

7. The median peak detector of claim 6, further comprising:

a disk drive for housing a disk, including a pickup head for reading data from the disk;

control circuit means for correctly positioning the pickup head; and wherein the median value of each burst of pulses is used by the control circuit means for positioning the pickup head.

8. A circuit for determining the median peak amplitude of a burst of pulses, comprising:

a peak detector;

sample and hold circuit means connected to the output of the peak detector for storing the peak amplitude of each pulse;

latching means for comparing the peak amplitude of each pulse to the peak amplitude of every other pulse; and logic circuit means for determining the median peak amplitude of the burst of pulses from the stored comparisons of the peak amplitudes.

9. The circuit of claim 8, further comprising an analog multiplexer means responsive to an output of the logic circuit means for outputting the stored peak amplitude which is determined to be the median amplitude of the burst of pulses.

* * * * *